(12) United States Patent
Hayakawa et al.

(10) Patent No.: US 6,778,573 B2
(45) Date of Patent: Aug. 17, 2004

(54) FUNDAMENTAL-TRANSVERSE-MODE INDEX-GUIDED SEMICONDUCTOR LASER DEVICE HAVING UPPER OPTICAL WAVEGUIDE LAYER THINNER THAN LOWER OPTICAL WAVEGUIDE LAYER

(75) Inventors: Toshiro Hayakawa, Kaisei-machi (JP); Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 76 days.

(21) Appl. No.: 09/801,695

(22) Filed: Mar. 9, 2001

(65) Prior Publication Data

US 2001/0021212 A1 Sep. 13, 2001

(30) Foreign Application Priority Data

Mar. 9, 2000 (JP) .......................... 2000-064658

(51) Int. Cl.$^7$ ................................. H01S 5/00
(52) U.S. Cl. .................. 372/43; 372/44; 372/45; 372/46; 372/47; 372/50
(58) Field of Search .................. 372/43, 44, 45, 372/46, 47, 50, 48

(56) References Cited

U.S. PATENT DOCUMENTS

| | | | | |
|---|---|---|---|---|
| 5,386,429 A | * | 1/1995 | Naito et al. | 372/46 |
| 5,572,539 A | * | 11/1996 | Kondo | 372/45 |
| 6,195,373 B1 | * | 2/2001 | Fukunaga | 372/45 |
| 6,195,375 B1 | * | 2/2001 | Hirata | 372/46 |
| 6,285,695 B1 | * | 9/2001 | Asano et al. | 372/45 |

OTHER PUBLICATIONS

IEEE Journal of Selected Topics in Quantum Electronics; Hideyoshi Horie, et al.; "Reliability Improvement of 980–nm Laser Diodes with a New Facet Passivation Process"; vol. 5; p. 832 (1999).

IEEE Journal of Quantum Electronics; Hiro O. Yonezu, et al.; "An AIGaAs Window Structure Laser"; vol. QE–15; p. 775 (1979).

IEEE Journal of Selected Topics in Quantum Electronics; Kiyoshia Hiramoto, et al.; "High–Power and Highly Reliable Operation of A 1–Free InGaAs–InGaAsP 0.98–$\mu$ Lasers with a Window Structure Fabricated by Si Ion Implantation"; vol. 5; p. 817 (1999).

Japanese Journal of Applied Physics; "Highly Reliable 150 mW CW Operation of Single–Stripe AiGaAs Lasers with Window Grown on Facets"; Kazuaki Sasaki, et al.; vol. 30, p. L904 (1991).

Applied Physics Letters; T. Hayakawa, et al.; "Effects of Broad–waveguide structure in 0.8 $\mu$m high–power InGaAsP/InGaP/AIGaAs Lasers"; vol. 75; p. 1839 (1999).

Electronics Letters; R.M. Lammert, et al.; "980nm high power, high slope efficiency distributed feedback lasers with nonabsorbing mirrors"; vol. 34, p. 1663 (1998).

\* cited by examiner

*Primary Examiner*—Paul Ip
*Assistant Examiner*—Armando Rodriguez
(74) *Attorney, Agent, or Firm*—Sughrue Mion, PLLC

(57) ABSTRACT

In a semiconductor laser device including having an index-guided structure and oscillating in a fundamental transverse mode, a lower cladding layer, a lower optical waveguide layer, a quantum well layer, an upper optical waveguide layer, and a current confinement structure are formed in this order. The thickness of the upper optical waveguide layer is smaller than the thickness of the lower optical waveguide layer. In addition, the sum of the thicknesses of the upper and lower optical waveguide layers may be 0.5 micrometers or greater. Further, the distance between the bottom of the current confinement structure and the upper surface of the quantum well layer may be smaller than 0.25 micrometers.

15 Claims, 3 Drawing Sheets

F I G . 5
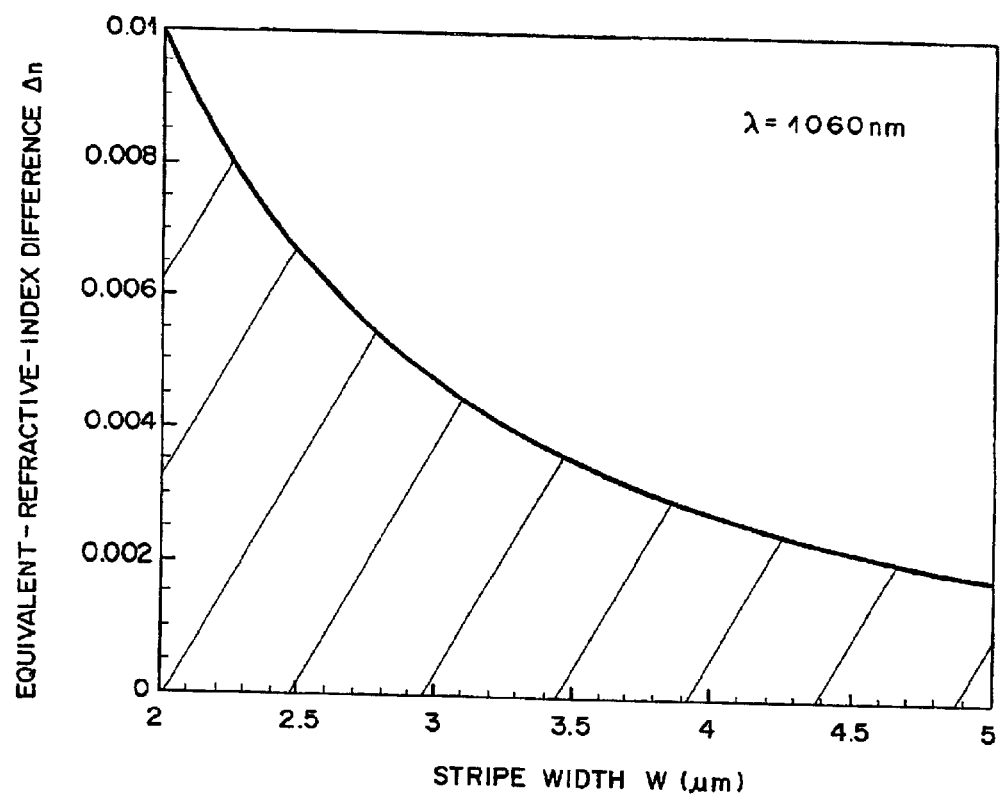

FUNDAMENTAL-TRANSVERSE-MODE INDEX-GUIDED SEMICONDUCTOR LASER DEVICE HAVING UPPER OPTICAL WAVEGUIDE LAYER THINNER THAN LOWER OPTICAL WAVEGUIDE LAYER

BACKGROUND OF THE INVENTION

1. Field of the Invention

The present invention relates to a semiconductor laser device which oscillates in a fundamental transverse mode.

2. Description of the Related Art

Practical optical output power of high-quality narrow-stripe semiconductor laser devices oscillating in a fundamental transverse mode is increasing year by year. Recently, the practical optical output power of fundamental-transverse-mode semiconductor laser devices is remarkably increasing. In particular, the practical optical output power of 0.98 μm band fundamental-transverse-mode semiconductor laser devices which are used for exciting an Er doped optical fiber amplifier is 250 mW or more. In addition, the practical optical output power of 0.78 μm band and 0.65 μm band fundamental-transverse-mode semiconductor laser devices are also increasing, where the 0.78 μm band and 0.65 μm band fundamental-transverse-mode semiconductor laser devices are used in recordable CDs (compact disks) and recordable DVDs (compact disks), respectively. The increase in the practical optical output power is also important in various applications in the fields of image recording. Further, semiconductor laser devices having higher output power are required in digital drive printers, such as laser thermal printers, using sensitized material having relatively low sensitivity.

In the above applications, stability of the fundamental transverse mode is required as well as the high output power and high reliability of the semiconductor laser devices. However, the output power of the fundamental-transverse-mode semiconductor laser devices has an upper limit which is determined by the two factors.

The first factor is decrease in the reliability due to facet degradation caused by high optical density at the light-exit end facet. The facet degradation can be greatly reduced by high-quality end-facet coating or use of an unabsorbent end-facet window structure. The high-quality end-facet coating is disclosed in IEEE Journal of Selected Topics in Quantum Electronics, Vol. 5, p. 832 (1999). The use of the unabsorbent end-facet window structure is disclosed in IEEE Journal of Quantum Electronics, Vol. QE-15, p. 775 (1979), IEEE Journal of Selected Topics in Quantum Electronics, Vol. 5, p. 817 (1999), Japanese Journal of Applied Physics, Vol. 30, p. L904 (1991), and Electronics Letters, Vol. 34, p. 1663 (1998).

The second factor is stability of the fundamental mode. In high-power semiconductor laser devices having output power in excess of 200 mW, the stripe width W and the equivalent-refractive-index difference Δn in the direction parallel to the active layer (i.e., a difference in the equivalent refractive index between the area of the active region under the stripe and the other area) in the index-guided structure are designed so that higher transverse modes are cut off. FIG. 5 shows a primary mode cut-off condition in the case where the oscillation wavelength is 1,060 nm. In the hatched area under the curve indicated in FIG. 5, the semiconductor laser device can stably oscillate in the fundamental mode. For example, when the stripe width W is 2.5 micrometers, and the equivalent-refractive-index difference Δn is $4\times10^{-3}$, the semiconductor laser device can stably oscillate in the fundamental transverse mode. However, when the output power of the actual semiconductor laser devices is increased to hundreds of milliwatts, the optical output-current characteristic deviates from a straight line, and the radiation pattern is deformed. This is the upper limit of the stable fundamental transverse mode. Since the carrier density of the active layers of semiconductor laser devices is about $10^{18}$ cm$^{-3}$, the refractive index is decreases by about $2\times10^{-3}$ due to the plasma effect, and spatial hole burning of the carrier density is caused by the increase in the optical output power. Accordingly, the refractive index irregularly varies in the direction of the extent of the active layer. Therefore, although the higher modes do not occur, the laser beam is shifted in the horizontal direction, i.e., a so-called beam steering occurs. Thus, the fundamental transverse mode becomes unstable.

In addition, high-output-power semiconductor laser devices usually include a so-called SCH (separate confinement heterostructure) having a quantum well. As reported in Applied Physics Letters, Vol. 75, p. 1839 (1999), it is known that the reliability of the semiconductor laser devices in a high-output-power operation increases when the thickness of the optical waveguide layer is increased, since the optical density at the light-exit end face is reduced by the increase in the thickness of the optical waveguide layer. However, when the thickness of the optical waveguide layer is increased, the amount of light penetrated into the cladding layer is decreased. Therefore, it is not easy to realize a difference in the refractive index from the active layer. Further, the present inventors have found that the transverse modes become unstable when the thickness of the optical waveguide layer is great. Since the distance between the active layer and the current confinement layer is increased by the thickness of the optical waveguide layer, carriers widely spread in the direction parallel to the active layer when the thickness of the optical waveguide layer is great. Thus, the transverse modes become unstable.

SUMMARY OF THE INVENTION

An object of the present invention is to provide a semiconductor laser device which can stably oscillate in a fundamental transverse mode even when the output power is high.

According to the present invention, there is provided a semiconductor laser device having an index-guided structure and oscillating in a fundamental mode, comprising: a lower cladding layer; a lower optical waveguide layer formed above the lower cladding layer; a quantum well layer formed above the lower optical waveguide layer; an upper optical waveguide layer formed above the quantum well layer; and a current confinement structure formed above the upper optical waveguide layer. The upper optical waveguide layer has a first thickness smaller than a second thickness of the lower optical waveguide layer. Further, additional semiconductor layers may be formed between the above layers.

In other words, the semiconductor laser device according to the present invention comprises an SCH structure in which a quantum well layer is sandwiched between optical waveguide layers, and the quantum well layer is not located at the center of the SCH structure. That is, the SCH structure is not symmetric about the quantum well layer, which is located relatively near to the current confinement layer. According to this arrangement of the SCH structure, the current injected into the semiconductor laser device does not widely spread, and therefore the semiconductor laser device according to the present invention can maintain a stable oscillation in a fundamental transverse mode even when the output power is high.

Preferably, the semiconductor laser device according to the present invention may also have one or any possible combination of the following additional features (i) to (viii).

(i) Barrier layers may be formed between the quantum well layer and the upper and lower optical waveguide layers.

(ii) The sum of the first and second thicknesses may be 0.5 micrometers or greater. In this case, the semiconductor laser device can oscillate with higher output power.

(iii) The distance between the bottom of the current confinement structure and the upper surface of the quantum well layer may be smaller than 0.25 micrometers. The bottom of the current confinement structure determines the stripe width of the current confinement structure. When the index-guided structure is realized by a ridge structure, the bottom of the current confinement structure is the bottom of the ridge portion. When the index-guided structure is realized by an internal stripe structure, the bottom of the current confinement structure is the bottom of a stripe groove in a current confinement layer. When the semiconductor laser device has the additional feature (iii), the spread of the current injected into the semiconductor laser device can be limited to a small extent. Therefore, the maximum optical output power obtained by a stable oscillation in the fundamental transverse mode is increased.

(iv) In the semiconductor laser device having the additional feature (iii), the bottom of the current confinement structure may be arranged on the upper surface of the quantum well layer. Generally, the current confinement structure is formed in a cladding layer. In the semiconductor laser device according to the present invention, a portion of the upper cladding layer may be formed between the upper optical waveguide layer and the bottom of the current confinement structure. However, it is preferable that the bottom of the current confinement structure is arranged on the upper surface of the upper optical waveguide layer, i.e., no layer intervenes between the upper optical waveguide layer and the bottom of the current confinement structure.

(v) The lower optical waveguide layer, the quantum well layer, and the upper optical waveguide layer may be made of an aluminum-free semiconductor material. In this case, the respective layers are less prone to oxidation during formation of the layers. Therefore, the reliability of the semiconductor laser device is increased.

(vi) In the semiconductor laser device having the additional feature (v), at least one of the lower cladding layer and the upper cladding layer may be made of a semiconductor material containing aluminum. In this case, the energy gap of the cladding layer is increased, and the leakage of electrons can be prevented. Therefore, temperature characteristics are improved.

(vii) The index-guided structure may be an internal stripe type or a ridge waveguide type.

(viii) The index-guided structure may have a stripe width of 4 micrometers or smaller.

The semiconductor laser device according to the present invention oscillates in a fundamental transverse mode. The values of the stripe width and the equivalent-refractive-index difference are selected so that the condition for fundamental-transverse-mode oscillation is satisfied, and the higher modes can be cut off in the respective oscillation wavelength bands. For example, when the oscillation wavelength is 1,060 nm, the values of the stripe width and the equivalent-refractive-index difference are in the hatched area under the curve indicated in FIG. 5. In particular, the frequently used values of the stripe width and the equivalent-refractive-index difference are in vicinities of 2.5 micrometers and $4\times10^{-3}$, respectively.

When the index-guided structure is realized by an internal stripe structure, the equivalent-refractive-index difference is a difference in the equivalent refractive index in propagation modes in the thickness direction, between portions of the active region under the current confinement layer and the other portion of the active region under the stripe groove, which is formed in the current confinement layer, and filled with a portion of the cladding layer. When the index-guided structure is realized by a ridge structure, the equivalent-refractive-index difference is a difference in the equivalent refractive index in propagation modes in the thickness direction, between portions of the active region under the ridge portion and the other portion of the active region.

DESCRIPTION OF THE DRAWINGS

FIG. 5 is a graph indicating a condition for cutting off the higher modes.

DESCRIPTION OF PREFERRED EMBODIMENTS

Embodiments of the present invention are explained in detail below with reference to drawings.

First Embodiment

The construction a semiconductor laser device as the first embodiment of the present invention and a process of producing the construction are explained with reference to FIG. 1, which is a cross-sectional view of the semiconductor laser device as the first embodiment.

Figure 1:
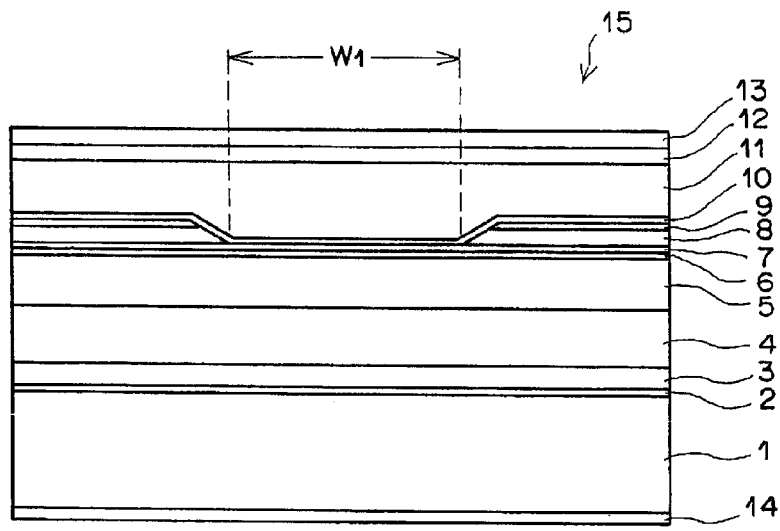
FIG. 1 is a cross-sectional view of a semiconductor laser device as the first embodiment of the present invention.

As illustrated in FIG. 1, in the first MOCVD (metal organic chemical vapor deposition) stage, an n-type GaAs buffer layer 2 being doped with $5\times10^{17}$ cm$^{-3}$ Si and having a thickness of 0.5 micrometers, an n-type $Al_xGa_{1-x}As$ graded buffer layer 3 being doped with $5\times10^{17}$ cm$^{-3}$ Si and having a thickness of 0.2 micrometers (where x gradually increases from 0.1 to 0.55), an n-type $Al_{0.55}Ga_{0.45}As$ lower cladding layer 4 being doped with $5\times10^{17}$ cm$^{-3}$ Si and having a thickness of 1 micrometer, an undoped $In_{0.48}Ga_{0.52}P$ lower optical waveguide layer 5 having a thickness of 0.55 micrometers, an undoped $In_{0.13}Ga_{0.87}As_{0.75}P_{0.25}$ quantum well layer 6 having a thickness of 10 nm, an undoped $In_{0.48}Ga_{0.52}P$ upper optical waveguide layer 7 having a thickness of 0.15 micrometers, an n-type $Al_{0.7}Ga_{0.3}As$ current confinement layer 8 being doped with $1\times10^{18}$ cm$^{-3}$ Si and having a thickness of 0.8 micrometers, and an n-type $In_{0.48}Ga_{0.52}P$ layer 9 being doped with $1\times10^{18}$ cm$^{-3}$ Si and having a thickness of 10 nm are formed in this order by reduced-pressure MOCVD on an n-type GaAs substrate 1 which is doped with $2\times10^{18}$ cm$^{-3}$ Si.

Next, a stripe area of the n-type $In_{0.48}Ga_{0.52}P$ layer 9 having a width of 3 micrometers is removed by photolithography and etching using HCl. Then, a stripe groove having a width $W_1$ of 2.5 micrometers is formed in the n-type $Al_{0.7}Ga_{0.3}As$ current confinement layer 8 by etching using a tartaric acid etchant. This etching selectively stops just above the undoped $In_{0.48}Ga_{0.52}P$ upper optical waveguide layer 7.

In the second MOCVD stage, a p-type $In_{0.48}Ga_{0.52}P$ layer 10 being doped with $7\times10^{17}$ cm$^{-3}$ Zn and having a thickness of 15 nm, a p-type $Al_{0.55}Ga_{0.45}As$ upper cladding layer 11 being doped with $7\times10^{17}$ cm$^{-3}$ Zn and having a thickness of 1 micrometer, and a p-type GaAs cap layer 12 being doped with $2\times10^{19}$ cm$^{-3}$ Zn and having a thickness of 0.1 micrometers are formed in this order.

In the above layered structure, the total thickness of the lower and upper optical waveguide layers 5 and 7 is 0.7 micrometers, and the distance between the bottom of the current confinement structure (i.e., the bottom of the stripe groove in the current confinement layer 8) and the upper surface of the quantum well layer is 0.15 micrometers, which is the thickness of the upper optical waveguide layer 7.

Thereafter, the bottom surface of the n-type GaAs substrate 1 is polished until the total thickness of the layered structure becomes about 100 micrometers. Then, a (Ti/Pt/Ti/Pt/Au) p electrode 13 and an (AuGe/Ni/Au) n electrode 14 are formed by evaporation and heat treatment as illustrated in FIG. 1.

Next, a laser bar having a length of about 1 cm and a resonator length of 0.75 micrometers is cut out from the wafer formed as above by scribing with a diamond needle and cleaving, and optical coatings are provided on the light-exit end facet and the opposite surface so that the light-exit end facet has a reflectance of 5%, and the opposite surface has a reflectance of 95%. Then, discrete laser chips 15 having a width of about 500 micrometers are cut out by scribing with a diamond needle and cleaving. Finally, the p-electrode side of each laser chip is bonded to a copper heatsink (not shown) with indium solder having a thickness of 4 to 5 micrometers.

At room temperature, the semiconductor laser device produced as above can emit laser light having a wavelength of about 809 nm, above a threshold current of 20 mA, and operate in a fundamental transverse mode with output power up to 0.5 W so that a single-peak radiation pattern is maintained.

Figure 2:
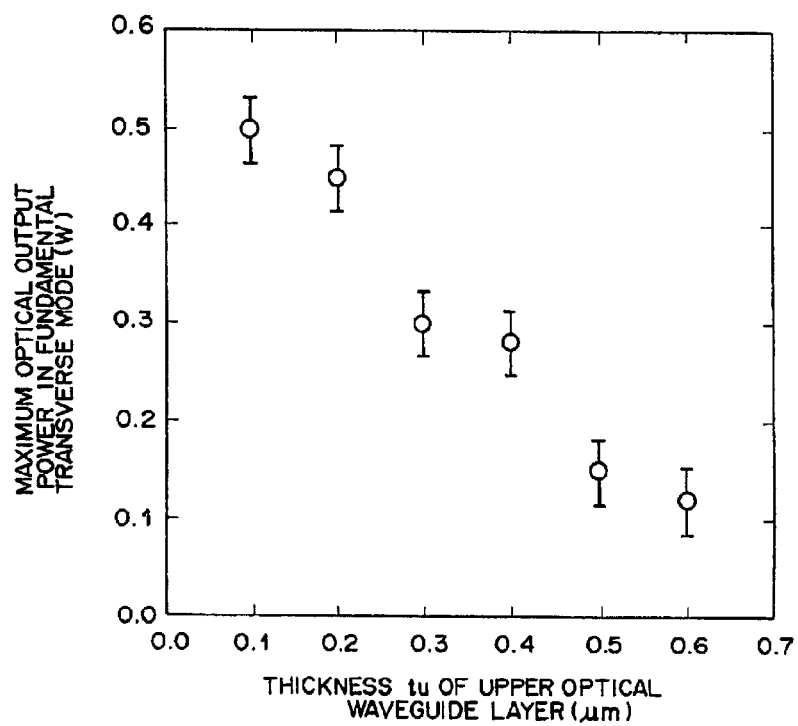
FIG. 2 is a graph indicating a result of measurement of a relationship between the thickness of the upper optical waveguide layer and the maximum optical output power.

A relationship between the thickness of the upper optical waveguide layer and the maximum optical output power is obtained by an experiment. A plurality of semiconductor laser devices each having the construction of the first embodiment and a different thickness $t_u$ of the $In_{0.48}Ga_{0.52}P$ upper optical waveguide layer 7 is measured for the maximum optical output power which can be output by the fundamental-transverse-mode operation, where the total thickness of the $In_{0.48}Ga_{0.52}P$ lower optical waveguide layer 5 and the $In_{0.48}Ga_{0.52}P$ upper optical waveguide layer 7 in the plurality of semiconductor laser devices is 0.7 micrometers. The result of the measurement is indicated in FIG. 2. As illustrated in FIG. 2, when the thickness $t_u$ of the $In_{0.48}Ga_{0.52}P$ upper optical waveguide layer 7 is smaller than 0.25 micrometers, the fundamental transverse mode can be maintained even when the output power is 400 mW or higher. That is, when the distance between the bottom of the current confinement structure and the quantum well layer is smaller than 0.25 micrometers, high output power is obtained by a stable fundamental-transverse-mode operation.

Second Embodiment

The construction a semiconductor laser device as the second embodiment of the present invention and a process of producing the construction are explained with reference to FIG. 3, which is a cross-sectional view of the semiconductor laser device as the second embodiment.

Figure 3:
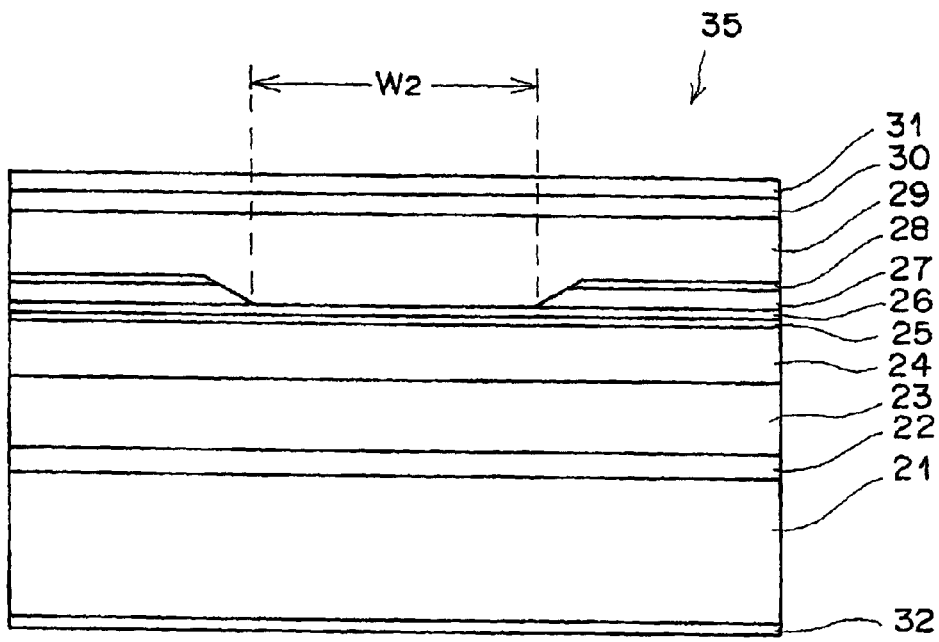
FIG. 3 is a cross-sectional view of a semiconductor laser device as the second embodiment of the present invention.

As illustrated in FIG. 3, in the first MOCVD stage, an n-type GaAs buffer layer 22 being doped with $5\times10^{17}$ cm$^{-3}$ Si and having a thickness of 0.5 micrometers, an n-type $In_{0.48}Ga_{0.52}P$ lower cladding layer 23 being doped with $5\times10^{17}$ cm$^{-3}$ Si and having a thickness of 1.5 micrometers, an $In_{0.13}Ga_{0.87}As_{0.75}P_{0.25}$ lower optical waveguide layer 24 having a thickness of 0.45 micrometers, an undoped $In_{0.16}Ga_{0.84}As$ compressive strain quantum well layer 25 having a thickness of 7 nm, an undoped $In_{0.13}Ga_{0.87}As_{0.75}P_{0.25}$ upper optical waveguide layer 26 having a thickness of 0.1 micrometers, an n-type $In_{0.48}(Ga_{0.4}Al_{0.9})_{0.52}P$ current confinement layer 27 being doped with $2\times10^{18}$ cm$^{-3}$ Si and having a thickness of 0.8 micrometers, and an n-type $In_{0.48}Ga_{0.52}P$ layer 28 being doped with $2\times10^{18}$ cm$^{-3}$ Si and having a thickness of 10 nm are formed in this order by reduced-pressure MOCVD on an n-type GaAs substrate 21 which is doped with $2\times10^{18}$ cm$^{-3}$ Si. The lower portion of the $In_{0.13}Ga_{0.87}As_{0.75}P_{0.25}$ lower optical waveguide layer 24 having a thickness of 0.4 micrometers is doped with $8\times10^{17}$ cm$^{-3}$ Si, and the upper portion of the $In_{0.13}Ga_{0.87}As_{0.75}P_{0.25}$ lower optical waveguide layer 24 having a thickness of 0.05 micrometers is undoped.

Next, a stripe groove having a width W2 of 2.5 micrometers is formed in the n-type $In_{0.48}Ga_{0.52}P$ layer 28 and the n-type $In_{0.48}(Ga_{0.1}Al_{0.9})_{0.52}P$ current confinement layer 27 by photolithography and etching using HCl. This etching selectively stops just above the undoped $In_{0.13}Ga_{0.87}As_{0.75}P_{0.25}$ upper optical waveguide layer 26.

In the second MOCVD stage, a p-type $In_{0.48}Ga_{0.52}P$ upper cladding layer 29 being doped with $7\times10^{17}$ cm$^{-3}$ Zn and having a thickness of 1 micrometer and a p-type GaAs cap layer 30 being doped with $2\times10^{19}$ cm$^{-3}$ Zn and having a thickness of 0.1 micrometers are formed in this order.

In the above layered structure, the total thickness of the lower and upper optical waveguide layers 24 and 26 is 0.55 micrometers, and the distance between the bottom of the current confinement structure (i.e., the bottom of the stripe groove in the current confinement layer 27) and the upper surface of the quantum well layer is 0.1 micrometers, which is the thickness of the upper optical waveguide layer 26.

Thereafter, the bottom surface of the n-type GaAs substrate 21 is polished until the total thickness of the layered structure becomes about 100 micrometers. Then, a (Ti/Pt/Au) p electrode 31 and an (AuGe/Ni/Au) n electrode 32 are formed by evaporation and heat treatment as illustrated in FIG. 3.

Next, a laser bar is cut out, end facets are coated, and laser chips 35 are cut out in a similar manner to the first embodiment. The semiconductor laser device as the second embodiment oscillates at the wavelength of 980 nm.

Third Embodiment

The construction a semiconductor laser device as the third embodiment of the present invention and a process of producing the construction are explained with reference to FIG. 4, which is a cross-sectional view of the semiconductor laser device as the third embodiment.

Figure 4:
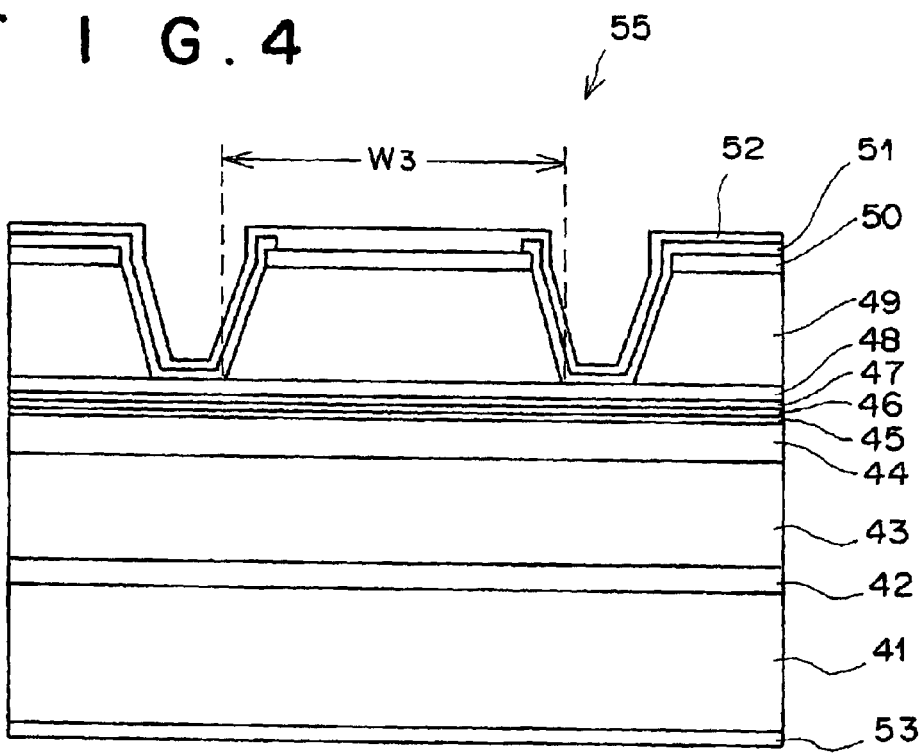
FIG. 4 is a cross-sectional view of a semiconductor laser device as the third embodiment of the present invention.

As illustrated in FIG. 4, an n-type GaAs buffer layer 42 being doped with $1\times10^{18}$ cm$^{-3}$ Si and having a thickness of 0.5 micrometers, an n-type $In_{0.48}Ga_{0.52}P$ lower cladding layer 43 being doped with $1\times10^{18}$ cm$^{-3}$ Si and having a thickness of 1.2 micrometers, an $In_{0.1}Ga_{0.9}As_{0.8}P_{0.2}$ lower optical waveguide layer 44 having a thickness of 0.9 micrometers, an undoped $GaAs_{0.8}P_{0.2}$ tensile strain barrier layer 45 having a thickness of 10 nm, an undoped $In_{0.28}Ga_{0.72}As$ compressive strain quantum well layer 46 having a thickness of 7 nm, an undoped $GaAs_{0.8}P_{0.2}$ tensile strain barrier layer 47 having a thickness of 10 nm, an undoped $In_{0.1}Ga_{0.9}As_{0.8}P_{0.2}$ upper optical waveguide layer 48 having a thickness of 0.15 micrometers, a p-type $In_{0.48}Ga_{0.52}P$ upper cladding layer 49 being doped with $7\times10^{17}$ cm$^{-3}$ Zn and having a thickness of 1 micrometer, and a p-type GaAs cap layer 50 being doped with $2\times10^{19}$ cm$^{-3}$ Zn and having a thickness of 0.1 micrometers are formed in this order by reduced-pressure MOCVD on an n-type GaAs substrate 41 which is doped with $2\times10^{18}$ cm$^{-3}$ Si. The lower portion of the $In_{0.1}Ga_{0.9}As_{0.8}P_{0.2}$ lower optical waveguide layer 44 having a thickness of 0.8 micrometers is doped with $8\times10^{17}$ cm$^{-3}$ Si, and the upper portion of the $In_{0.1}Ga_{0.9}As_{0.8}P_{0.2}$ lower optical waveguide layer 44 having a thickness of 0.1 micrometers is undoped.

Next, a pair of stripe grooves each having a width of 10 micrometers are formed by photolithography and chemical etching using HCl so that a ridge stripe structure having a width $W_2$ of 2.5 micrometers is formed between the pair of stripe grooves. This etching selectively stops just above the undoped $In_{0.1}Ga_{0.9}As_{0.8}P_{0.2}$ upper optical waveguide layer 48. Thereafter, a $SiO_2$ insulation film 51 is formed on the above layered structure by plasma CVD, and then a portion of the $SiO_2$ insulation film 51 on the top surface of the mesa is removed by using photolithography and dry etching.

In the above layered structure, the total thickness of the lower and upper optical waveguide layers 44 and 48 is 1 micrometer, and the distance between the bottom of the current confinement structure (i.e., the bottom of the ridge portion) and the upper surface of the quantum well layer is 0.15 micrometers, which is the thickness of the upper optical waveguide layer 48.

Thereafter, a (Ti/Pt/Ti/Pt/Au) p electrode 52 is formed by evaporation and heat treatment, and the bottom surface of the n-type GaAs substrate 41 is polished until the total thickness of the layered structure becomes about 100 micrometers. Then, an (AuGe/Ni/Au) n electrode 53 is formed by evaporation and heat treatment. Finally, a laser bar is cut out, end facets are coated, and laser chips 55 are cut out in a similar manner to the first embodiment. The semiconductor laser device as the third embodiment oscillates at the wavelength of 1,060 nm.

In order to control the semiconductor laser devices according to the present invention having the stripe width of 2.5 micrometers, in a fundamental transverse mode, it is preferable that the equivalent-refractive-index difference is $5\times10^{-3}$ or smaller. In the semiconductor laser devices as the first to third embodiments, the equivalent-refractive-index difference is 2 to $4\times10^{-3}$.

Additional Matters (i) Although no cladding layer is arranged between the upper optical waveguide layer and the bottom of the current confinement structure in the first to third embodiments, it is possible to arrange a thin cladding layer between the upper optical waveguide layer and the bottom of the current confinement structure for prevention of leakage current into the upper cladding layer, convenience of crystal growth, and the like. However, in this case, it is also preferable to make the distance between the bottom of the current confinement structure and the upper surface of the quantum well layer less than 0.25 micrometers.

(ii) Although the first to third embodiments relate to semiconductor laser devices which are formed on GaAs substrates, and oscillate at the wavelength in the range of 809 to 1,060 nm, the present invention can be applied to other semiconductor laser devices which are formed on GaAs substrates, and oscillate at other wavelengths, and semiconductor laser devices which are formed on InP substrates, and oscillate mainly at wavelengths of 1.3 to 1.7 micrometers. Further, the present invention can be applied to InGaAlN-based semiconductor laser devices in the short wavelength range.

(iii) Although the first to third embodiments relate to semiconductor laser devices including a single quantum well active layer, the present invention can be applied to semiconductor laser devices which has an active layer including a multiple quantum well structure.

What is claimed is:

1. A semiconductor laser device having an index-guided structure and oscillating in a fundamental mode, comprising:
   a lower cladding layer;
   a lower optical waveguide layer formed above said lower cladding layer;
   a quantum well layer formed above said lower optical waveguide layer;
   an upper optical waveguide layer formed above said quantum well layer; and
   a current confinement structure formed above said upper optical waveguide layer;
   said upper optical waveguide layer has a first thickness smaller than a second thickness of said lower optical waveguide layer.
   wherein a sum of said first and second thickness is 0.5 micrometers or greater.

2. A semiconductor laser device according to claim 1, wherein a bottom of said current confinement structure is at a height smaller than 0.25 micrometers above an upper surface of said quantum well layer.

3. A semiconductor laser device according to claim 2, wherein said bottom of said current confinement structure is arranged on an upper surface of said upper optical waveguide layer.

4. A semiconductor laser device according to claim 1, wherein said lower optical waveguide layer, said quantum well layer, and said upper optical waveguide layer are made of an aluminum-free semiconductor material.

5. A semiconductor laser device according to claim 4, wherein said lower cladding layer is made of a semiconductor material containing aluminum.

6. A semiconductor laser device according to claim 1, wherein said index-guided structure is an internal stripe type or a ridge waveguide type.

7. A semiconductor laser device having an index-guided structure and oscillating in a fundamental transverse mode, comprising:
   a lower cladding layer;
   a lower optical waveguide layer formed above said lower cladding layer;
   a quantum well layer formed above said lower optical waveguide layer;
   an upper optical waveguide layer formed above said quantum well layer; and a current confinement structure formed above said upper optical waveguide layer;

said upper optical waveguide layer has a first thickness smaller than a second thickness of said lower optical waveguide layer;

wherein said index-guided structure has a stripe width of 4 micrometers or smaller.

8. A semiconductor laser device having an index-guided structure and oscillating in a fundamental mode, comprising:

a lower cladding layer;

a lower optical waveguide layer formed above said lower cladding layer;

a quantum well layer formed above said lower optical waveguide layer;

an upper optical waveguide layer formed above said quantum well layer; and a current confinement structure formed above said upper optical waveguide layer;

an upper cladding layer disposed across a longitudinal direction of the index-guided structure to form a physical contact at a first edge and a second edge, the first and second edges aligned with longitudinal edges of the lower cladding layer;

wherein the current confinement layer is formed above said upper optical waveguide layer to be in physical contact with said upper optical waveguide layer.

9. A semiconductor laser device according to claim 8, wherein said upper optical waveguide layer has a first thickness, and said lower optical waveguide layer has a second thickness, and a sum of said first and second thickness is 0.5 micrometers or greater.

10. A semiconductor laser device having an index-guided structure and oscillating in a fundamental mode, comprising:

a lower cladding layer;

a lower optical waveguide layer formed above said lower cladding layer;

a quantum well layer formed above said lower optical waveguide layer;

an upper optical waveguide layer formed above said quantum well layer; and a current confinement structure formed above said upper optical waveguide layer;

wherein the current confinement layer is formed above said upper optical waveguide layer to be in physical contact with said upper optical waveguide layer;

wherein said lower optical waveguide layer, said quantum well layer, and said upper optical waveguide layer are made of an aluminum-free semiconductor material.

11. A semiconductor laser device according to claim 10, wherein said lower cladding layer is made of a semiconductor material containing aluminum.

12. A semiconductor laser device according to claim 8, wherein said index-guided structure is an internal stripe type or a ridge waveguide type.

13. A semiconductor laser device according to claim 8, wherein said index-guided structure has a stripe width of 4 micrometers or smaller.

14. The semiconductor laser device of claim 1, wherein the sum of the first and second thicknesses is 0.5 micrometers or greater but less than or equal to 0.9 micrometers.

15. The semiconductor laser device of claim 1, wherein the sum of the first and second thicknesses is 0.5 micrometers or greater but less than or equal to 0.70 micrometers.

* * * * *